US009679929B2

(12) United States Patent
Lee et al.

(10) Patent No.: US 9,679,929 B2
(45) Date of Patent: Jun. 13, 2017

(54) BINARY IMAGE SENSORS INCLUDING QUANTUM DOTS AND UNIT PIXELS THEREOF

(71) Applicant: Samsung Electronics Co., Ltd., Suwon-si, Gyeonggi-do (KR)

(72) Inventors: GwideokRyan Lee, Suwon-si (KR); SangChul Sul, Suwon-si (KR); Myungwon Lee, Hwaseong-si (KR); Min-ho Kim, Seongnam-si (KR); Taechan Kim, Yongin-si (KR); Taeseok Oh, Seoul (KR); KwangHyun Lee, Seongnam-si (KR); Taeyon Lee, Seoul (KR); Younggu Jin, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 604 days.

(21) Appl. No.: 14/052,168

(22) Filed: Oct. 11, 2013

(65) Prior Publication Data

US 2014/0103193 A1    Apr. 17, 2014

Related U.S. Application Data

(60) Provisional application No. 61/713,175, filed on Oct. 12, 2012.

(30) Foreign Application Priority Data

Mar. 8, 2013    (KR) .................... 10-2013-0025083

(51) Int. Cl.
*H01L 27/146*    (2006.01)
*B82Y 20/00*    (2011.01)

(52) U.S. Cl.
CPC .... *H01L 27/14609* (2013.01); *H01L 27/1461* (2013.01); *H01L 27/14612* (2013.01); *H01L 27/14679* (2013.01); *B82Y 20/00* (2013.01)

(58) Field of Classification Search
CPC ......... H01L 27/14612; H01L 27/14603; H01L 27/146; H01L 27/1461; H01L 27/14601;
(Continued)

(56) References Cited

U.S. PATENT DOCUMENTS 5,224,172 A    6/1993    Masai
5,288,988 A    2/1994    Hashimoto et al.
(Continued)

FOREIGN PATENT DOCUMENTS

JP    01-280974    11/1989
JP    04-267670    9/1992
(Continued)

OTHER PUBLICATIONS

Eric R. Fossum, "Quanta Image Sensor: Possible paradigm shift for the future", Mar. 22, 2012, "Grand Keynote", IntertechPira Image Sensors 2012 London, England, UK (http://ericfossum.com/Presentations/2012%20March%20QIS%20London.pdf).

*Primary Examiner* — Que T Le
*Assistant Examiner* — Jennifer Bennett
(74) *Attorney, Agent, or Firm* — Myers Bigel, P.A.

(57) ABSTRACT

A binary image sensor includes a plurality of unit pixels on a substrate having a surface on which light is incident. At least one quantum dot is disposed on the surface of a substrate. A column sense amplifier circuit is configured to detect binary information of a selected unit pixel among the plurality of unit pixels from a voltage or a current detected from the selected unit pixel, and a processing unit is configured to process binary information of the respective unit pixels to generate pixel image information. Related devices and methods of operation are also discussed.

10 Claims, 14 Drawing Sheets

(58) Field of Classification Search
CPC ........ H01L 27/14609; H01L 27/14679; H04N 5/3355; H04N 5/335; H04N 5/341; H04N 5/3745; B82Y 20/00
USPC ....... 250/208.1, 214 R, 214.1; 348/272, 280, 348/281, 294, 297, 300, 302, 308; 257/290, 291, 292, 257, 258, 431, 443
See application file for complete search history.

(56) References Cited

U.S. PATENT DOCUMENTS

| | | | |
|---|---|---|---|
| 5,665,959 | A | 9/1997 | Fossum et al. |
| 5,808,677 | A | 9/1998 | Yonemoto |
| 6,445,022 | B1 | 9/2002 | Barna et al. |
| 6,483,541 | B1 | 11/2002 | Yonemoto et al. |
| 6,552,746 | B1 | 4/2003 | Yang et al. |
| 6,587,145 | B1 | 7/2003 | Hou et al. |
| 6,720,589 | B1* | 4/2004 | Shields .................. B82Y 10/00 257/14 |
| 6,784,933 | B1 | 8/2004 | Nakai |
| 6,791,611 | B2 | 9/2004 | Yang |
| 6,975,324 | B1 | 12/2005 | Valmiki et al. |
| 7,113,212 | B2 | 9/2006 | Yonemoto et al. |
| 7,148,927 | B2 | 12/2006 | Ogura et al. |
| 7,176,432 | B2 | 2/2007 | Komiya |
| 7,542,345 | B2 | 6/2009 | Okhonin et al. |
| 7,746,400 | B2 | 6/2010 | Mo |
| 7,791,034 | B2 | 9/2010 | Kameshima et al. |
| 7,825,971 | B2 | 11/2010 | Hynecek |
| 7,858,917 | B2 | 12/2010 | Stern et al. |
| 7,859,582 | B2 | 12/2010 | Gomi |
| 7,923,801 | B2 | 4/2011 | Tian et al. |
| 8,143,685 | B2 | 3/2012 | Cha et al. |
| 8,154,640 | B2 | 4/2012 | Cha et al. |
| 8,174,604 | B2 | 5/2012 | Shibata et al. |
| 8,175,408 | B2 | 5/2012 | Hagiwara |
| 8,193,482 | B2 | 6/2012 | Itzer |
| 8,208,053 | B2 | 6/2012 | Nishihara |
| 8,213,212 | B2 | 7/2012 | Sargent et al. |
| 8,284,587 | B2 | 10/2012 | Sargent et al. |
| 8,319,855 | B2 | 11/2012 | Yang et al. |
| 8,405,017 | B2 | 3/2013 | Neter et al. |
| 8,420,996 | B2 | 4/2013 | Rissa et al. |
| 9,052,381 | B2 | 6/2015 | Woolaway et al. |
| 2001/0002099 | A1 | 5/2001 | Itoh et al. |
| 2001/0020909 | A1 | 9/2001 | Sakuragi et al. |
| 2003/0025817 | A1 | 2/2003 | Yonemoto et al. |
| 2003/0193585 | A1 | 10/2003 | Ogura et al. |
| 2004/0076032 | A1* | 4/2004 | Chae .................. B82Y 10/00 365/145 |
| 2004/0245435 | A1 | 12/2004 | Komiya |
| 2005/0012033 | A1 | 1/2005 | Stern et al. |
| 2005/0067637 | A1* | 3/2005 | Jang .................. H01L 27/14601 257/233 |
| 2005/0078205 | A1 | 4/2005 | Hynecek |
| 2005/0201149 | A1* | 9/2005 | Duan .................. B82Y 10/00 365/185.03 |
| 2007/0187775 | A1 | 8/2007 | Okhonin et al. |
| 2007/0285548 | A1 | 12/2007 | Gomi et al. |
| 2008/0001538 | A1* | 1/2008 | Cok .................. B82Y 20/00 313/506 |
| 2008/0089599 | A1 | 4/2008 | Hagiwara |
| 2009/0033779 | A1 | 2/2009 | Mo |
| 2009/0052262 | A1 | 2/2009 | Nii |
| 2009/0146071 | A1 | 6/2009 | Kameshima et al. |
| 2009/0152664 | A1* | 6/2009 | Klem .................. H01L 27/14603 257/440 |
| 2009/0251581 | A1 | 10/2009 | Cha et al. |
| 2009/0256156 | A1 | 10/2009 | Hsieh |
| 2009/0268031 | A1* | 10/2009 | Honma .................. A47L 9/00 348/162 |
| 2009/0290056 | A1 | 11/2009 | Itoh et al. |
| 2010/0007780 | A1 | 1/2010 | Nishihara |
| 2010/0019296 | A1 | 1/2010 | Cha et al. |
| 2010/0097510 | A1 | 4/2010 | Wada et al. |
| 2010/0155703 | A1* | 6/2010 | Jun .................. B82Y 10/00 257/24 |
| 2010/0320515 | A1 | 12/2010 | Fossum et al. |
| 2010/0329566 | A1 | 12/2010 | Nikula et al. |
| 2011/0002179 | A1 | 1/2011 | Kim et al. |
| 2011/0050969 | A1 | 3/2011 | Nishihara |
| 2011/0080510 | A1 | 4/2011 | Nishihara |
| 2011/0101205 | A1 | 5/2011 | Tian et al. |
| 2011/0121421 | A1 | 5/2011 | Charbon et al. |
| 2011/0134264 | A1 | 6/2011 | Nishihara et al. |
| 2011/0149274 | A1 | 6/2011 | Rissa et al. |
| 2011/0149658 | A1 | 6/2011 | Aritome |
| 2011/0155892 | A1 | 6/2011 | Neter et al. |
| 2011/0176019 | A1 | 7/2011 | Yang et al. |
| 2011/0204210 | A1 | 8/2011 | Itzler |
| 2011/0249148 | A1 | 10/2011 | Prescher et al. |
| 2011/0267510 | A1 | 11/2011 | Malone et al. |
| 2011/0278541 | A1 | 11/2011 | Huang et al. |
| 2012/0006975 | A1 | 1/2012 | Shibata et al. |
| 2012/0057059 | A1 | 3/2012 | Eldesouki et al. |
| 2012/0200734 | A1 | 8/2012 | Tang |
| 2012/0217413 | A1 | 8/2012 | Kameshima et al. |
| 2012/0224447 | A1 | 9/2012 | Kitayama |
| 2012/0235021 | A1 | 9/2012 | Kasai |
| 2013/0147979 | A1 | 6/2013 | McMahon et al. |
| 2014/0104469 | A1 | 4/2014 | Kim et al. |
| 2014/0104472 | A1 | 4/2014 | Kim et al. |
| 2014/0117247 | A1 | 5/2014 | Hamlin |
| 2014/0293102 | A1 | 10/2014 | Vogelsang et al. |

FOREIGN PATENT DOCUMENTS

| | | |
|---|---|---|
| JP | 2003-319265 | 11/2003 |
| JP | 2005-252743 | 9/2005 |
| JP | 2006-005312 | 1/2006 |
| JP | 2006-094192 | 4/2006 |
| JP | 2006-270292 | 5/2006 |
| JP | 2006-237772 | 9/2006 |
| JP | 2009-239668 | 10/2009 |
| JP | 2012-124338 | 6/2012 |
| KR | 1020090012759 A | 2/2009 |
| KR | 1020100079088 A | 7/2010 |
| KR | 101026923 | 4/2011 |

* cited by examiner

BINARY IMAGE SENSORS INCLUDING QUANTUM DOTS AND UNIT PIXELS THEREOF

CROSS-REFERENCE TO RELATED APPLICATIONS

A claim for priority under 35 U.S.C. §119 is made to U.S. Provisional Patent Application No. 61/713,175 filed Oct. 12, 2012, in the U.S. Patent and Trademark Office, and to Korean Patent Application No. 10-2013-0025083 filed Mar. 8, 2013, in the Korean Intellectual Property Office, the disclosures of which are hereby incorporated by reference herein in their entireties.

BACKGROUND

The inventive concepts described herein relate to binary image sensors and unit pixels of binary image sensors.

An image sensor is a device which can convert an optical image into an electrical signal. As computer and communications industries develop, demand for image sensors having improved performance may increase in various fields such as digital cameras, camcorders, PCS (Personal Communication Systems), game machines, security cameras, medical micro cameras, robots, and so on.

A charge coupled device (CCD) image sensor and/or a CMOS image sensor may be used as an image sensor. The CMOS image sensor may be characterized in that a driving manner is simpler and a signal processing circuit is integrated in a single chip for downsizing. Since power consumption of the CMOS image sensor is relatively low, the CMOS image sensor may be more easily applied to products with a limited battery capacity. Also, the CMOS image sensor may be fabricated using a CMOS process technology, so that fabrication costs may be reduced.

The CMOS image sensor or the CCD image sensor may be formed of a plurality of pixels constituting or made up of unit pixels. A size of a pixel may be about 2 micrometers (μm). In the event that a pixel is fabricated to have a size less than 1 μm, it may be difficult to achieve performance improvement of the image sensor, for example, due to a narrower dynamic range, a smaller full well capacity, and/or a signal to noise ratio (SNR) of less than about 10 to 20:1.

SUMMARY

According to some embodiments of the inventive concepts, a binary image sensor includes a plurality of unit pixels on a substrate having a surface that is configured to receive incident light. The unit pixels respectively include source and drain regions in the substrate and a channel region therebetween, and a gate electrode on the channel region. The unit pixels further respectively include at least one quantum dot on the surface of the substrate, and a charge storage region between the gate electrode and the at least one quantum dot.

In some embodiments, the charge storage region may be configured to store carriers therein that are generated by the quantum dot responsive to incident light.

In some embodiments, the channel region may be configured such that an electrostatic potential thereof differs responsive to a quantity and/or type of the carriers stored in the charge storage region.

In some embodiments, the unit pixels may be configured to operate responsive to different wavelengths of light. The plurality of unit pixels may define a pixel of a pixel array.

In some embodiments, the unit pixels may respectively include a quantum dot of a different material. The unit pixels may be separated by an isolation layer therebetween.

Some embodiments of the inventive concepts provide a binary image sensor which comprises a plurality of unit pixels on a substrate having one surface on which light is incident and at least one quantum dot disposed on the one surface of the substrate; a column sense amplifier circuit configured to detect binary information of a selected unit pixel among the plurality of unit pixels from a voltage or a current detected from the selected unit pixel; and a processing unit configured to process binary information of the respective unit pixels to generate pixel image information.

In some embodiments, the column sense amplifier circuit decides the binary information to be 1 when the voltage or current is over a threshold value and to be 0 when the voltage or current is below the threshold value.

In some embodiments, the pixel image information is formed of a set of three or four unit pixels.

In some embodiments, the processing unit accumulates binary information of the respective unit pixels constituting a set of the unit pixels to generate the pixel image information.

In some embodiments, the processing unit generates the pixel image information based on binary information of one of unit pixels constituting a set of the unit pixels.

In some embodiments, the at least one quantum dot is formed of different materials.

In some embodiments, the at least one quantum dot has different sizes.

In some embodiments, the unit pixels include red, green and blue unit pixels.

Other embodiments of the inventive concepts are directed to provide a unit pixel of a binary image sensor which comprises a substrate having one surface on which light is incident; at least one quantum dot disposed on the one surface of the substrate; a gate electrode disposed on the other surface of the substrate; source and drain areas formed at both sides of the gate electrode; a channel area formed between the source and drain areas; and a charge storage area formed between the channel area and the at least one quantum dot and configured to store carriers transferred from the at least one quantum dot.

In some embodiments, when a gate voltage is applied to the gate electrode, carriers stored at the charge storage area lower an electrostatic potential of the channel area.

In some embodiments, a conductivity type of the charge storage area is different from conductivity types of the source and drain areas.

In some embodiments, the charge storage area is formed using an ion implantation manner.

In some embodiments, the at least one quantum dot and the charge storage area are adjacent to each other.

In some embodiments, the at least one quantum dot is formed of a metallic compound or a silicon compound.

In some embodiments, the metallic compound is formed of at least one compound of copper, tungsten, and aluminum.

BRIEF DESCRIPTION OF THE FIGURES

The above and other features of the present inventive concepts will become more apparent by describing in detail exemplary embodiments thereof with reference to the accompanying drawings, in which.

DETAILED DESCRIPTION

Figure 1:
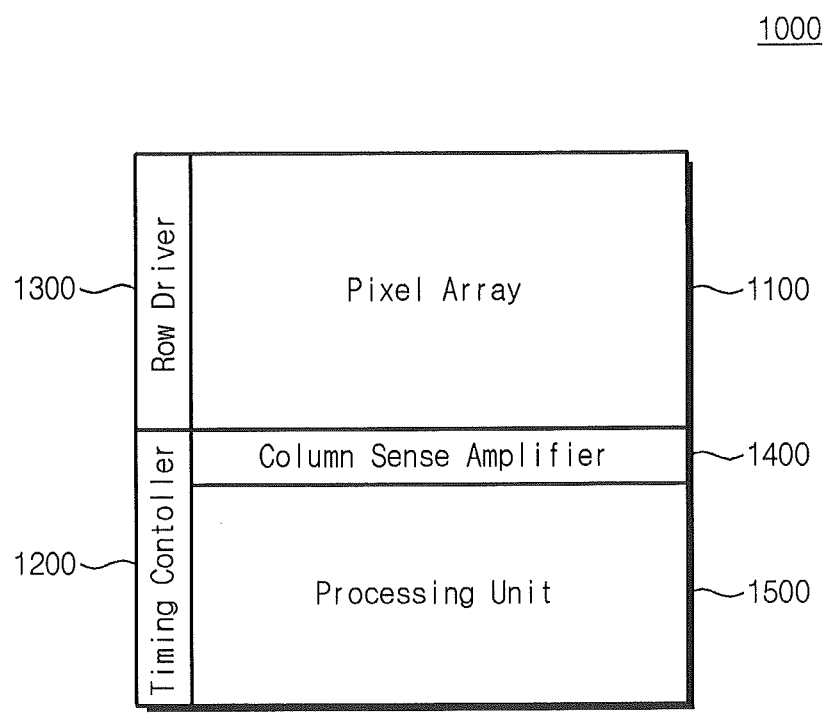
FIG. 1 is a block diagram schematically illustrating a binary image sensor according to some embodiments of the inventive concepts.

Exemplary embodiments of the present inventive concepts will be described more fully hereinafter with reference to the accompanying drawings. Like reference numerals may refer to like elements throughout the accompanying drawings.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

As used herein, the singular forms "a", "an" and "the" are intended to include the plural forms as well, unless the context clearly indicates otherwise.

It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on", "directly connected to", "directly coupled to", or "directly adjacent to" another element, there are no intervening elements present.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

FIG. 1 is a block diagram schematically illustrating a binary image sensor according to some embodiments of the inventive concepts.

Referring to FIG. 1, a binary image sensor 1000 according to some embodiments of the inventive concepts may include a pixel array 1100, a timing controller 1200, a row driver 1300, a column sense amplifier circuit 1400, and a processing unit 1500. For example, the components 1100 to 1500 may be integrated on a substrate to be designed to a one-chip shape.

The pixel array 1100 may include a plurality of pixels arranged two-dimensionally. Each pixel may include a plurality of unit pixels (or, called "JOT"). Each unit pixel may convert an input optical signal into an electrical signal. Each unit pixel may include at least one quantum dot. The quantum dot may refer to a material showing a quantum confinement effect as a nano-sized semiconductor material. A carrier (electrons and/or holes) generated by photon applied to the quantum dot may cause a variation in an electrical characteristic (e.g., a voltage, a current, etc.) of the unit pixel. Binary information of the unit pixel may be defined using a variation in an electrical characteristic of the unit pixel.

In example embodiments, the binary image sensor and the unit pixel of the binary image sensor may improve collection efficiency of light applied to the unit pixel using the quantum dot. Also, a crosstalk between unit pixels may be reduced by disposing the quantum dot for receiving light in each and/or every unit pixel. Thus, a wide dynamic range may be obtained. An analog-to-digital converter (ADC) of a conventional image sensor may be removed by defining binary information every unit pixel. The unit pixel will be more fully described with reference to FIGS. 4 to 7.

The timing controller 1200 may control operating timing of the image sensor 1000. The timing controller 1200 may provide the row driver 1300 and the column sense amplifier circuit 1400 with a timing signal, a control signal, and address information.

The row driver 1300 may control operation of the pixel array 1100 using the address information from the timing controller 1200. The row driver 1300 may provide the pixel array 1100 with driving signals for driving a plurality of pixels. In the event that a plurality of pixels is arranged in a matrix form, driving signals may be provided every row.

The column sense amplifier circuit 1400 may include a plurality of sense amplifiers for sensing data states of unit pixels. The column sense amplifier circuit 1400 may sense the unit pixels to acquire or determine binary information of a logic '1' or '0'. For example, when a current of a unit pixel sensed is over a threshold value, the column sense amplifier circuit 1400 may determine the binary information to be '1'. When the current of the unit pixel sensed is below the threshold value, the column sense amplifier circuit 1400 may determine the binary information to be '0'. In case of a unit pixel where a current flows, the column sense amplifier circuit 1400 may determine the binary information to be '1'. In case of a unit pixel where no current flows, the column sense amplifier circuit 1400 may determine the binary information to be '0'.

The processing unit 1500 may process binary information of the unit pixels to generate image information of pixels. For example, in the event that at least one of the unit pixels has binary information of '1', a pixel corresponding to the unit pixel having binary information of '1' may be processed to have image information of '1'. However, embodiments of the inventive concepts are not limited thereto. For example, pixel image information can be generated using various methods (e.g., a sum of binary information of unit pixels). That is, pixel image information may be decided according to binary information of unit pixels. Image information decided may be sent to an image data processing unit (not shown).

The image sensor 1000 according to some embodiments of the inventive concepts is applicable to and/or may otherwise be used in various multimedia devices having an image capture function. For example, the image sensor 1000 may be used in a mobile phone, a smart phone, a smart tablet, and so on. Also, the image sensor 1000 is applicable to a notebook computer, a television, a smart television, a digital camera, a digital camcorder, and so on.

Figure 2:
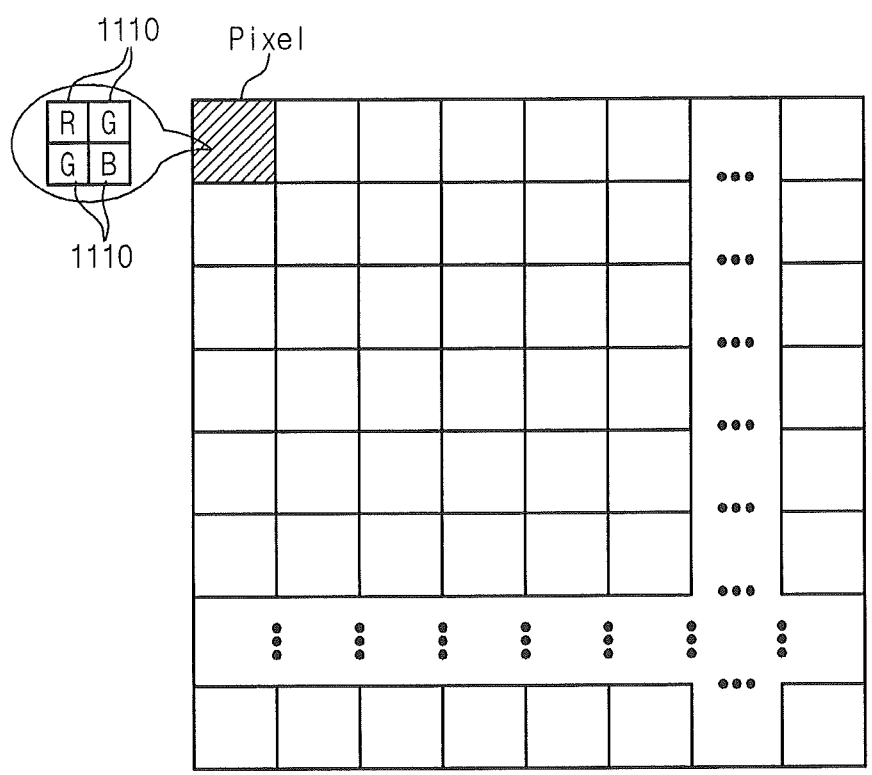
FIG. 2 is a diagram schematically illustrating a pixel array of FIG. 1.

FIG. 2 is a diagram schematically illustrating a pixel array of FIG. 1.

Referring to FIG. 2, a pixel array 1100 may include a plurality of pixels, each of which has a plurality of unit pixels 1110. For example, each pixel may have four unit pixels (in case of a PanTile structure). However, embodiments of the inventive concept are not limited thereto. For example, each pixel can be formed of three unit pixels. Each unit pixel may be a red, green or blue unit pixel.

Figure 3:
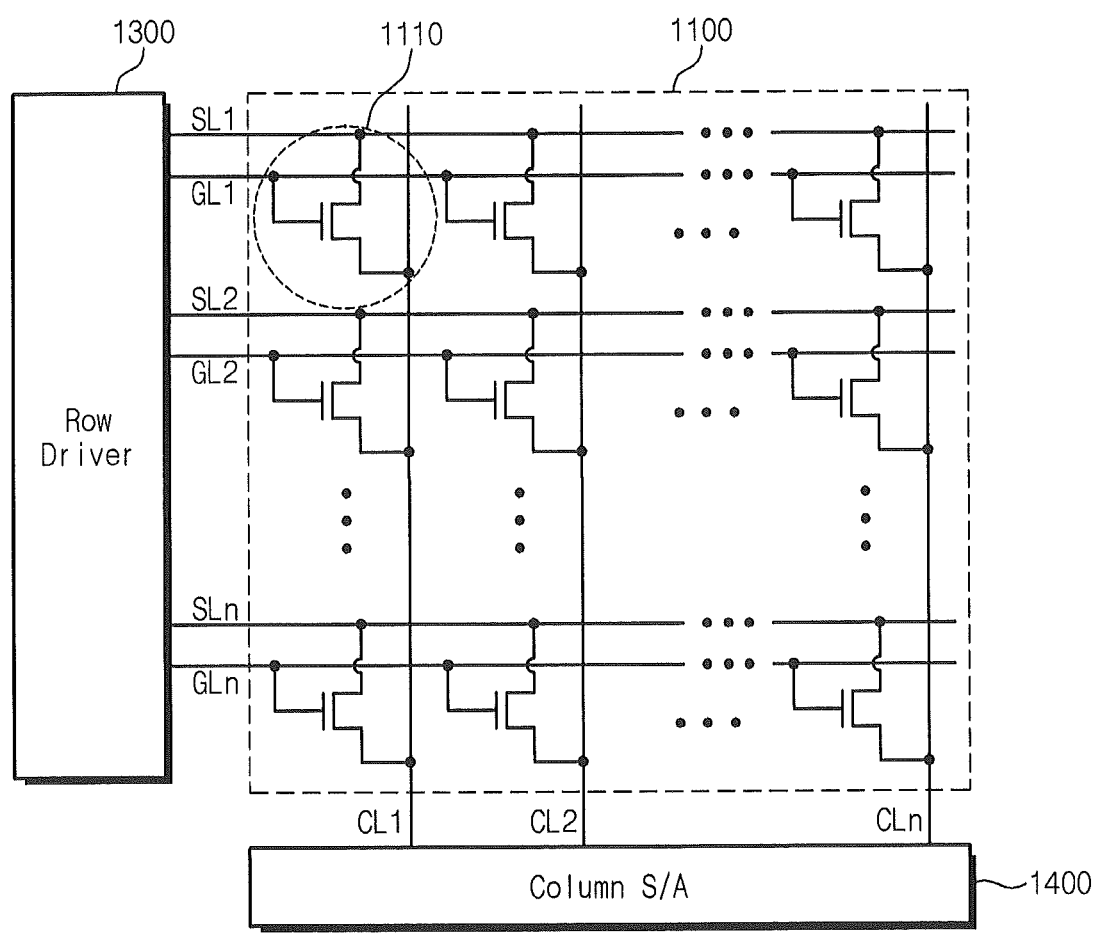
FIG. 3 is an equivalent circuit diagram of a pixel array of FIG. 1.

FIG. 3 is an equivalent circuit diagram of a pixel array of FIG. 1. Referring to FIG. 3, the unit pixels 1110 may be modeled by a floating body transistor. The unit pixels 1110 may be arranged in an array shape such that floating body transistors are interconnected.

Source lines SL1 to SLn of the pixel array 1100 may be connected with sources of unit pixels connected to a row. A row driver 1300 may apply a source voltage Vs to sources of unit pixels selected through the source lines SL1 to SLn.

Gate lines GL1 to GLn of the pixel array 1100 may be connected with gates of unit pixels connected to a row. The gate lines GL1 to GLn may be disposed in parallel with the source lines SL1 to SLn. The row driver 1300 may apply a gate voltage Vg to gates of unit pixels selected through the gate lines GL1 to GLn.

Drains of unit pixels may be connected to column lines CL1 to CLn of corresponding columns. A column sense amplifier circuit 1400 may sense currents or voltages of unit pixels selected through the column lines CL1 to CLn and detect binary information of unit pixels from the sensed currents or voltages.

Figure 4:
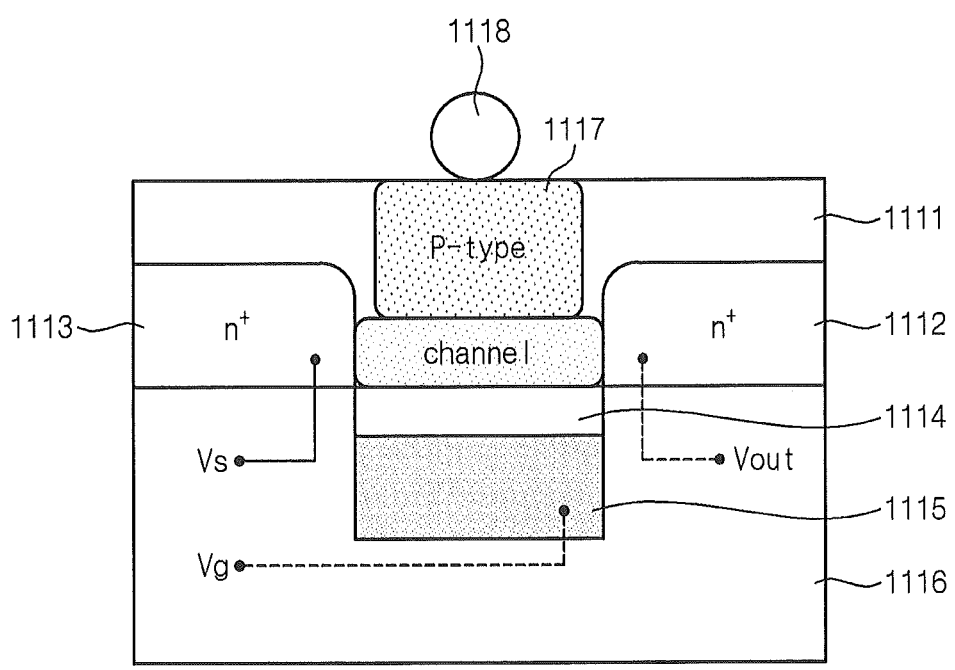
FIG. 4 is a cross-sectional view of a unit pixel of FIG. 3.

FIG. 4 is a cross-sectional view of a unit pixel of FIG. 3. The floating body transistor of FIG. 4 is illustrated by way of example as having a back side receiving structure where light is incident onto a back side of a substrate. It will be understood that conductivity types of areas described below are not limited to those shown herein by way of example.

Referring to FIG. 4, a unit pixel 1110 may include a first area or region 1111, a drain area or region 1112, a source area or region 1113, a gate insulation film 1114, a gate electrode 1115, a second area or region 1116, a charge storage area or region 1117, and a quantum dot 1118. The first area 1111 may be a silicon substrate, for example. The first area 1111 may be doped by a p-type impurity (or, n-type impurity). The drain area 1112 and the source area 1113 may be doped by an n-type impurity (or, p-type impurity) and are spaced apart from each other. The drain area 1112 and the source area 1113 may be highly doped. The conductivity type of the first area 1111 may be different from conductivity types of the drain area 1112 and the source area 1113.

A channel may be formed between the drain area 1112 and the source area 1113. The gate insulation film 1114 may be formed of a silicon oxide film (SiO2). The gate electrode 1115 may be a transparent metal (for example, an ITO (Indium Tin Oxide) electrode or a poly silicon electrode). The second area 1116 may be an insulation layer (e.g., a silicon oxide film (SiO2). Also, a metal line connected with the gate electrode 1115 may be formed at the second area 1116.

The charge storage area 1117 may be formed on the channel, for example, in a direction illustrated in FIG. 4. The charge storage area 1117 may be formed using an ion implantation. The conductivity type of the charge storage area 1117 may be opposite to that of the channel.

Carriers (electrons or holes) generated from the quantum dot 1118 may be stored at the charge storage area 1117. The stored carrier may influence an electrostatic potential of a channel, and a level of current flowing to the channel may be changed according to the change in electrostatic potential.

The quantum dot 1118 may generate carriers (electrons and/or holes) in response to an input or incident light. The quantum dot 1118 may be formed on the charge storage area 1117. The quantum dot 1118 may be formed of one or plural quantum dots, and may be fabricated by a self-aligned or patterning manner. The quantum dot 1118 may be n-type, p-type or a combination of n-type and p-type. The quantum dot 1118 may be formed of metal oxide (e.g., copper, tungsten, aluminum, etc.), silicon, or gallium arsenide (GaAs).

Figure 5:
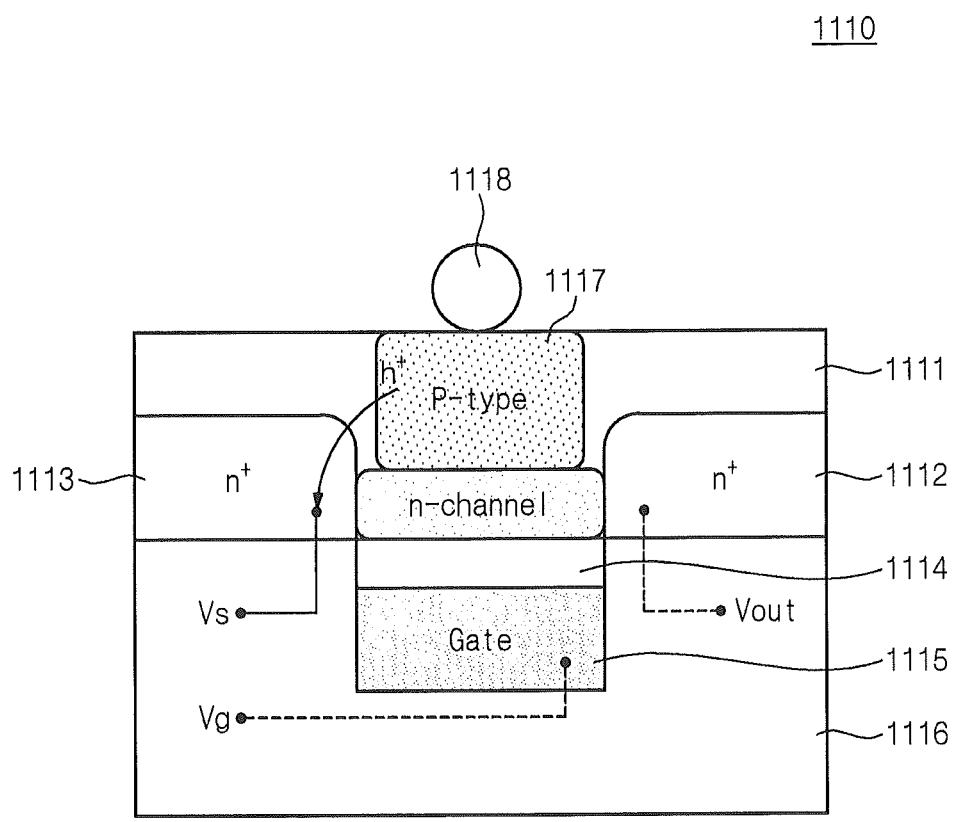
FIGS. 5 to 7 are cross-sectional views for describing operation of a unit pixel of FIG. 4.
Figure 6:
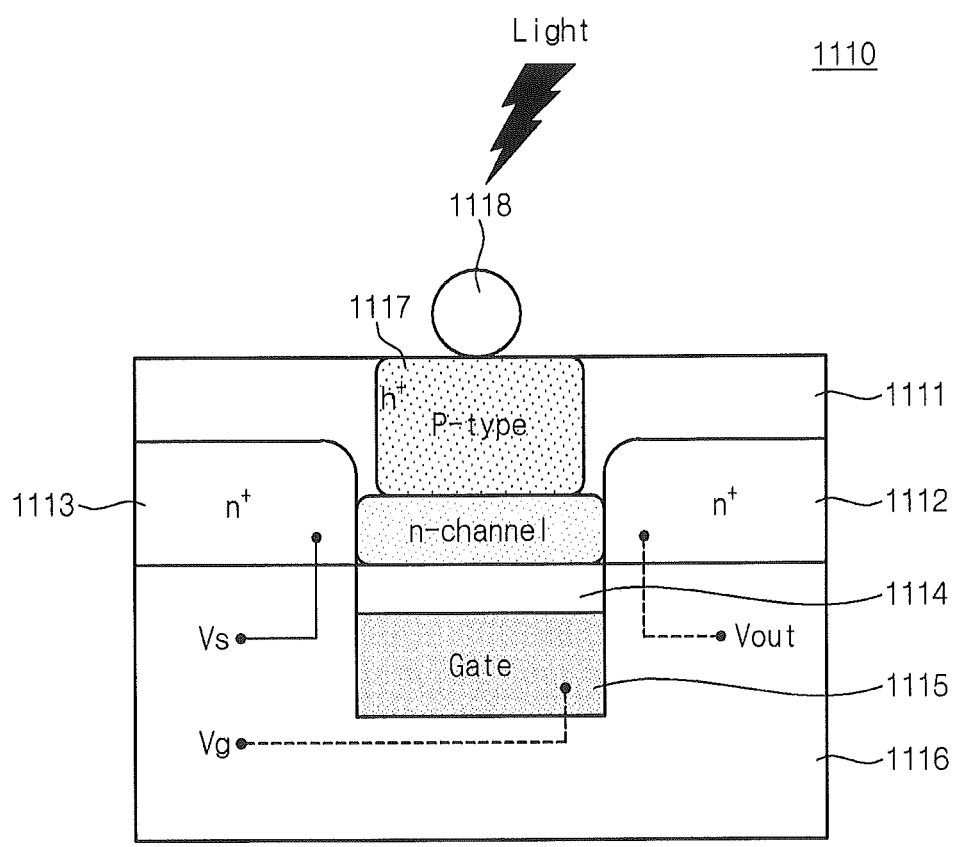
Figure 7:
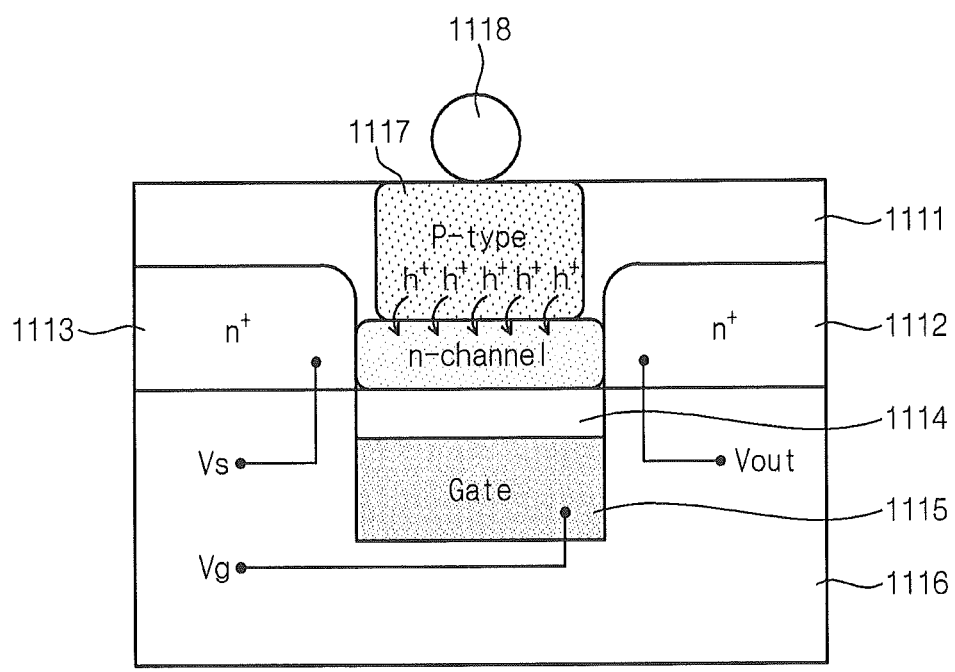

FIGS. 5 to 7 are cross-sectional views for describing operation of a unit pixel of FIG. 4. Reset, charging, and selection/reading operations of a unit pixel to be described with reference to FIGS. 5 to 7 may be iterated at one or more or every predetermined interval according to a control of a timing controller 1200. In FIGS. 5 to 7, there is illustrated an example in which drain and source areas 1112 and 1113 are n-type and a charge storage area 1117 is p-type. However, embodiments of the inventive concepts are not limited thereto.

A reset operation will be described with reference to FIG. 5. If a source voltage Vs is applied to a source area 1113 through a source line (refer to FIG. 3), carriers (e.g., holes) stored at a charge storage area 1117 may be removed. A polarity of the source voltage Vs may be opposite to that of the carrier. For example, the source voltage Vs may be negative voltage. During the reset operation, a gate voltage Vg may be set to a zero voltage.

A charge operation will be described with reference to FIG. 6. A charge operation may mean an operation where light is incident on or otherwise applied to a quantum dot 1118 for generation of carriers and the carriers generated are stored at the charge storage area 1117. For example, if light is applied to the quantum dot 1118, electron-hole pairs may be generated, and holes of the electron-hole pairs may be stored at the charge storage area 1117. The greater the strength of incident light, the more the number of holes stored at the charge storage area 1117. During the charge operation, the source voltage Vs and the gate voltage Vg may be set to a zero voltage.

A selection/read operation will be described with reference to FIG. 7. An electrostatic potential of a channel may be varied based on carriers stored at the charge storage area 1117. For example, if carriers stored at the charge storage area 1117 decrease the electrostatic potential of the channel, a current flowing to the channel may increase. In addition, as the strength of light incident on or otherwise applied to the quantum dot 1118 increases, the influence of carriers on the electrostatic potential of the channel may increase. That is, the number or quantity of carriers generated by unit pixels may differ according to the strength of light incident onto the quantum dot 1118. Thus, each unit pixel may generate different carriers relative to one another based on the strength of input light into each unit pixel. Accordingly, levels of currents flowing to channels of unit pixels may be varied. If a predetermined level of gate voltage Vg is applied to a gate electrode 1115 in the selection/read operation, a current according to a changed electrostatic potential may be formed at a channel. During the selection/read operation, the source voltage Vs may be set to a driving voltage Vdd and the gate voltage Vg may be set to a predetermined level of voltage.

Figure 8:
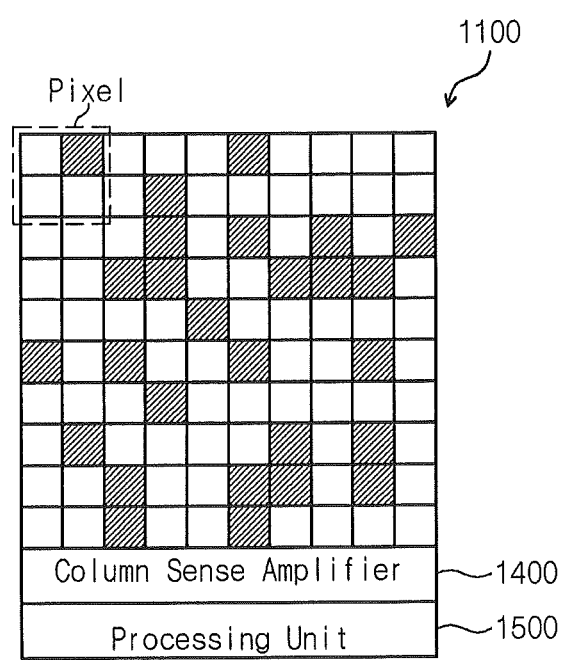
FIG. 8 is a conceptual diagram for describing operation of an image sensor of FIG. 1.

FIG. 8 is a conceptual diagram for describing operation of an image sensor of FIG. 1. In FIG. 8, it is assumed that a pixel array 1100 may include unit pixels arranged in 10 rows and 10 columns. Four unit pixels may form a pixel. Each unit pixel may have binary information. For example, it is assumed that unit pixels shaded have binary information of '1' and unit pixels not shaded have binary information of '0'.

Referring to FIG. 8, a column sense amplifier circuit 1400 of an image sensor 1000 (refer to FIG. 1) may perform a binary information sensing operation on respective unit pixels. For example, in the event that a sensing result of the column sense amplifier circuit 1400 indicates that a current of a unit pixel sensed is over a threshold value, binary information may be decided to be '1'. In the event that a sensing result of the column sense amplifier circuit 1400 indicates that a current of a unit pixel sensed is below a threshold value, binary information may be decided to be '0'.

The image sensor 1000 according to some embodiments of the inventive concepts may output binary information of the unit pixels, respectively. The binary information of the unit pixels may be processed by a processing unit 1500 to provide pixel image information.

Figure 9:
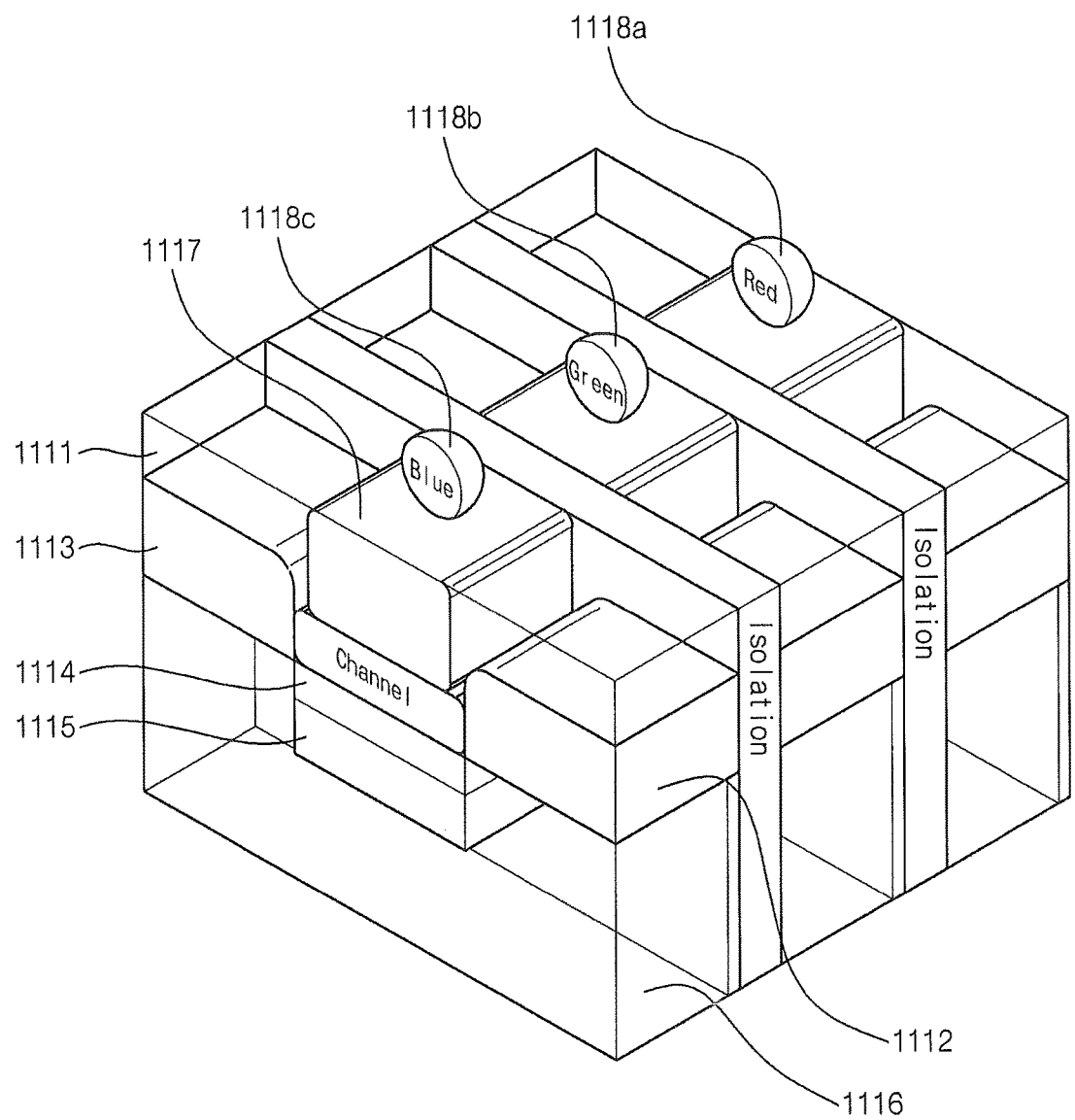
FIG. 9 shows an application of unit pixels according to some embodiments of the inventive concepts.

FIG. 9 shows an application of unit pixels according to some embodiments of the inventive concepts. Referring to FIG. 9, there is illustrated an example where three unit pixels are sequentially connected. Each unit pixel may have the same structure as that described with reference to FIG. 4. However, in this application, unit pixels may be configured to absorb different wavelengths of light using first to third quantum dots 1118a, 1118b, and 1118c formed of different materials. For example, it is possible to absorb different wavelengths of light by adjusting sizes or material composition (e.g., Si, GaAs, etc.) of the first to third quantum dots 1118a, 1118b, and 1118c.

For example, a unit pixel having the first quantum dot 1118a may absorb light having a wavelength (about 670 nm) corresponding to red R. A unit pixel having the second quantum dot 1118b may absorb light having a wavelength (about 570 nm) corresponding to green G. A unit pixel having the third quantum dot 1118c may absorb light having a wavelength (about 415 nm) corresponding to blue B.

According to this application, an image sensor 1000 (refer to FIG. 1) may acquire binary information from R, G, and B unit pixels. Thus, it is possible to generate independent image data on the R, G, and B unit pixels. This may mean that a color filter is not used, in contrast to some conventional image sensors. Also, since first to third quantum dots 1118a, 1118b, and 1118c of respective unit pixels are disposed to be physically separated, a crosstalk may be reduced.

Figure 10:
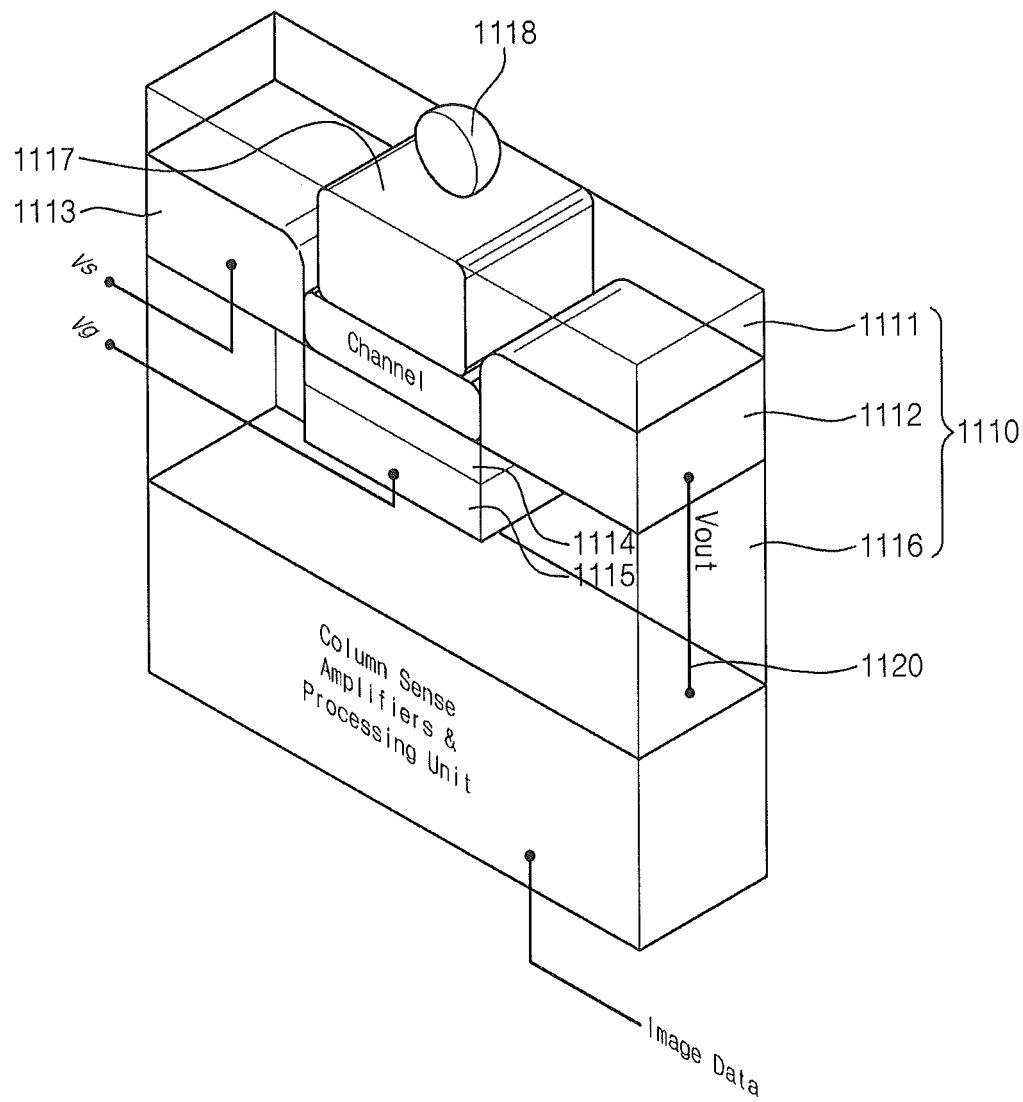
FIGS. 10 and 11 show image sensors according to other embodiments of the inventive concepts.
Figure 11:
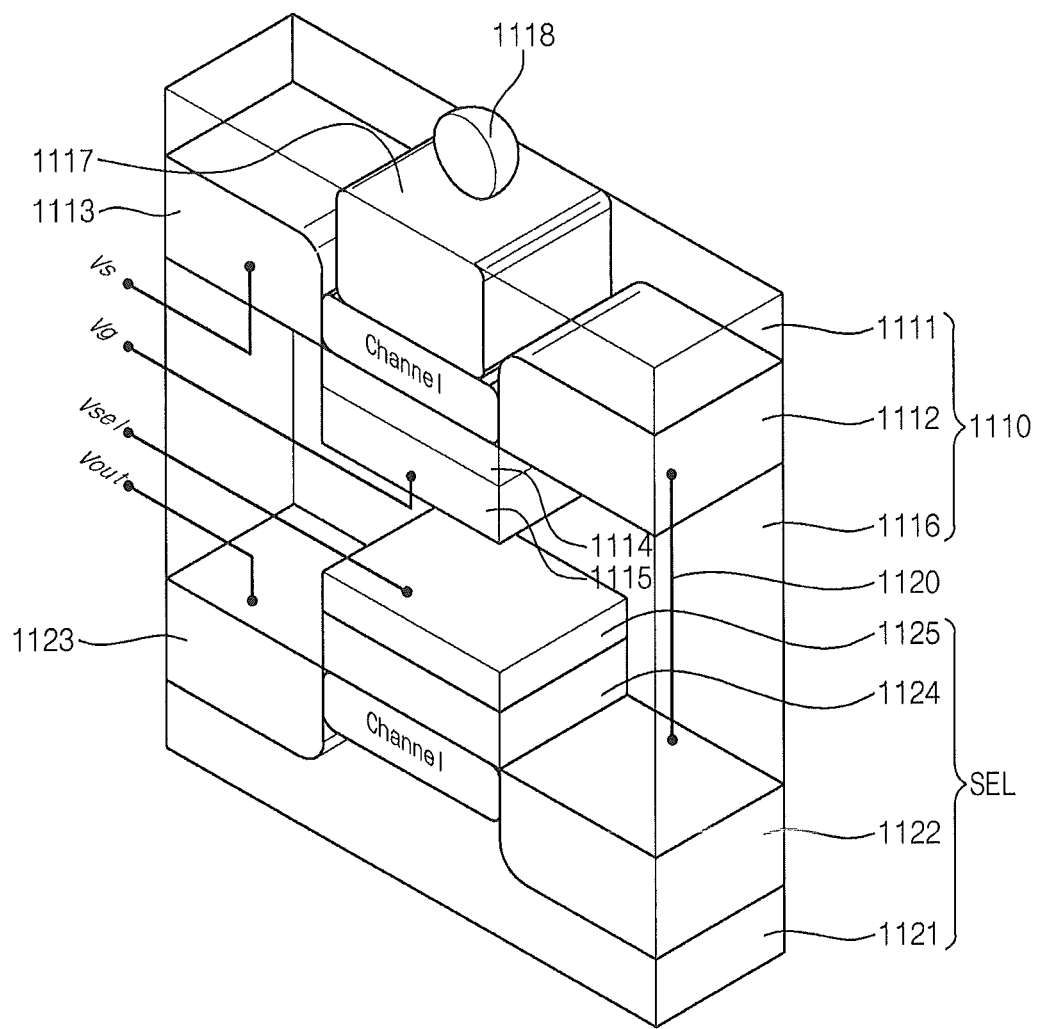

FIGS. 10 and 11 show image sensors according to other embodiments of the inventive concepts. Referring to FIG. 10, a column sense amplifier circuit 1400 and a processing unit 1500 may be integrated in a substrate. A substrate where unit pixels 1110 (refer to FIG. 4) are integrated and a substrate where the column sense amplifier circuit 1400 and the processing unit 1500 are integrated may be disposed to have a multi-stage structure. The unit pixels 1110 may be connected with the substrate where the column sense amplifier circuit 1400 and the processing unit 1500 are integrated, through vias 1120.

For example, the column sense amplifier circuit 1400 and the processing unit 1500 may be provided with a voltage or current output from a drain of the unit pixel 1110. The column sense amplifier circuit 1400 and the processing unit 1500 may operate the same as or as similarly described with reference to FIGS. 1 to 8. As described above, the image sensor may be scaled down by displaying the substrate where unit pixels are integrated and the substrate where the column sense amplifier circuit 1400 and the processing unit 1500 are integrated, to have a multi-stage structure.

Referring to FIG. 11, a selection transistor SEL (formed of 1121 to 1125) may be disposed under a unit pixel 1110 (refer to FIG. 4). The selection transistor SEL may include a substrate 1121, a drain area 1122, a source area 1123, a gate insulation film 1124, and a gate electrode 1125. A drain 1112 of the unit pixel 1110 and the drain 1122 of the selection transistor SEL may be interconnected through via 1120. A selection voltage Vsel may be applied to the gate electrode 1125 of the selection transistor SEL. Thus, the selection transistor SEL may operate as a switch. That is, a current or voltage output from the drain 1112 of the unit pixel 1110 may be output to an external device when the selection transistor SEL is turned on.

Figure 12:
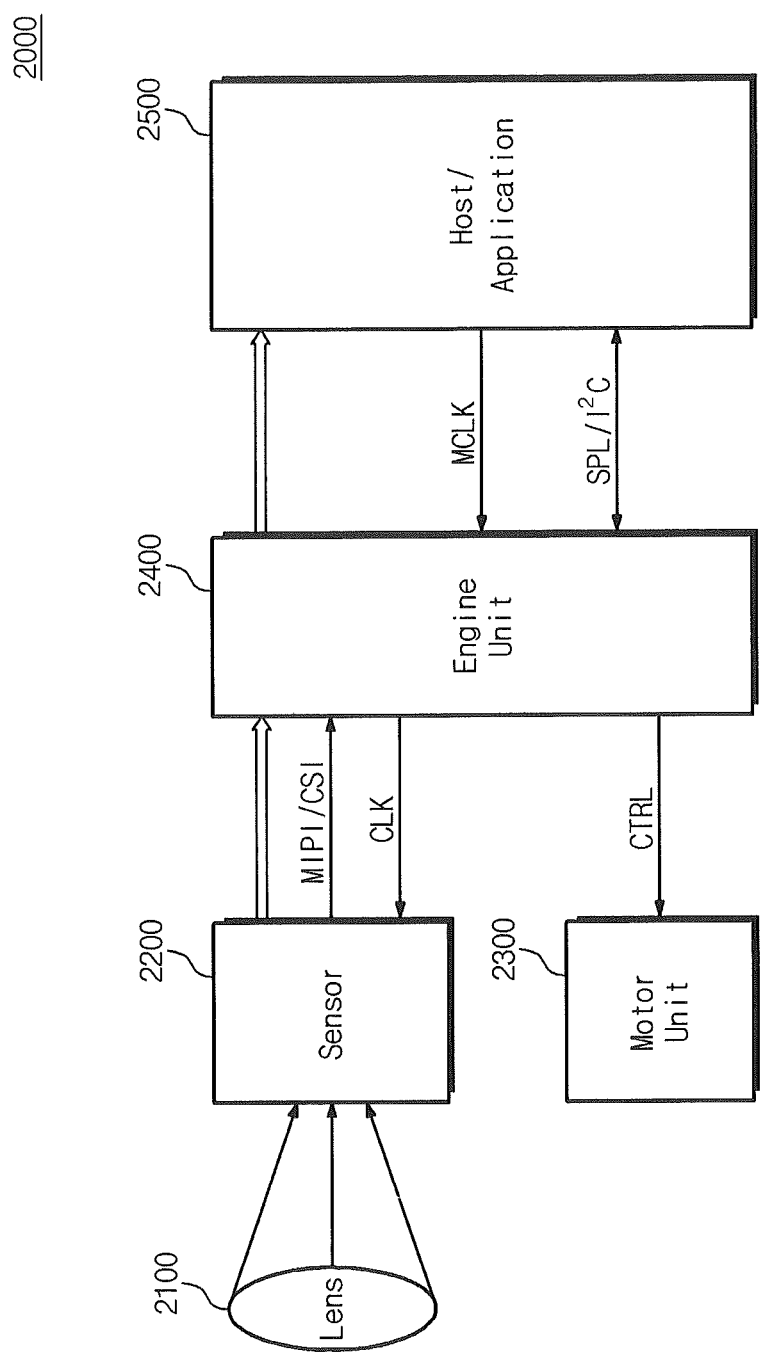
FIG. 12 is a block diagram schematically illustrating a camera system according to some embodiments of the inventive concepts.

FIG. 12 is a block diagram schematically illustrating a camera system according to some embodiments of the inventive concepts. Here, a camera system 2000 may include a digital camera. Referring to FIG. 12, the camera system 2000 may include a lens 2100, an image sensor 2200, a motor unit 2300, and an engine unit 2400.

The lens 2100 may collect light incident onto a receiving area of the image sensor 2200.

The image sensor 2200 may include a pixel array formed of unit pixels described with reference to FIGS. 1 to 7. The image sensor 2200 may also include a pixel array formed of unit pixels described with reference to FIG. 9. The image sensor 2200 may generate image data based on light incident through the lens 2100. The image sensor 2200 can generate image data based on a clock signal CLK. In exemplary embodiments, the image sensor 2200 may interface with the engine unit 2400 through MIPI (Mobile Industry Processor Interface) or CSI (Camera Serial Interface).

The motor unit 2300 may adjust a focus of the lens 2100 or perform shuttering in response to a control signal CTRL from the engine unit 2400.

The engine unit 2400 may control the image sensor 2200 and the motor unit 2300. The engine unit 2400 may generate YUV data based on a distance and/or image data from the image sensor 2200. Here, the YUV data may include a distance from an object, brightness component, difference between brightness component and blue component, and different between brightness component and red component. The engine unit 2400 may generate compression data, for example, JPEG (Joint Photography Experts Group) data. The engine unit 2400 may be connected with a host/application 2500. The engine unit 2400 may provide the host/application 2500 with YUV data or JPEG data based on a master clock MCLK. The engine unit 2400 may interface with the host/application 2500 through SPI (Serial Peripheral Interface) and/or I2C (Inter Integrated Circuit).

Figure 13:
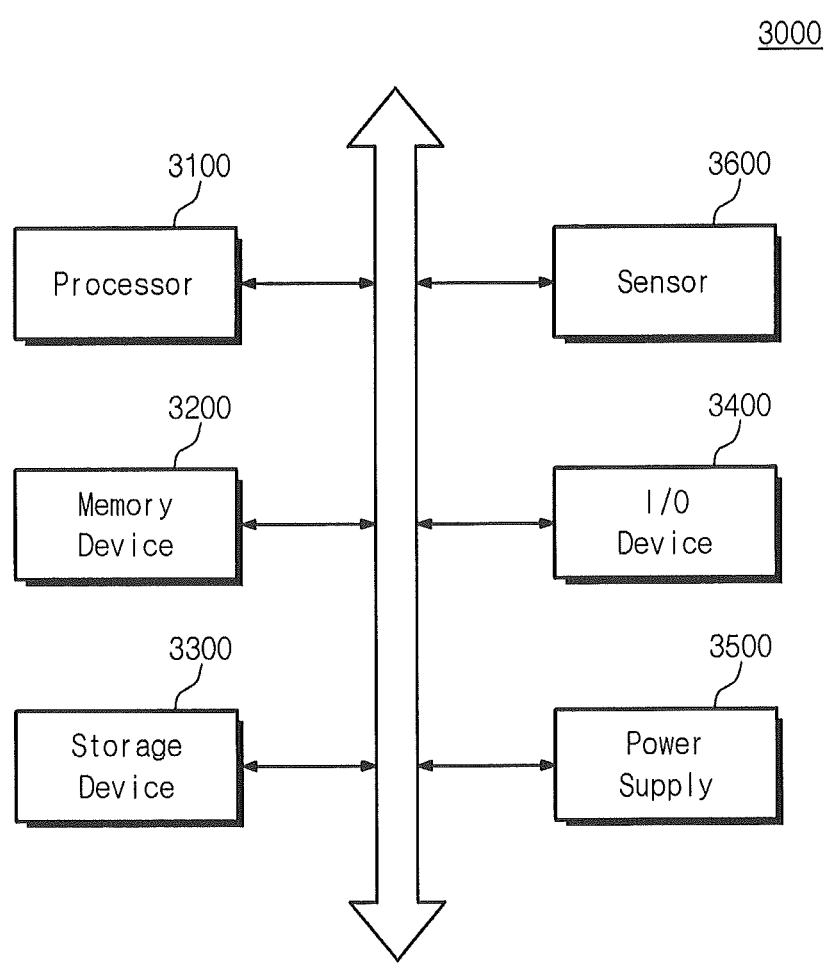
FIG. 13 is a block diagram schematically illustrating a computing system according to some embodiments of the inventive concepts.

FIG. 13 is a block diagram schematically illustrating a computing system according to some embodiments of the inventive concepts. Referring to FIG. 13, a computing system 3000 may include a processor 3100, a memory device 3200, a storage device 3300, an input/output device 3400, a power supply 3500, and an image sensor 3600. The computing system 3000 may further include ports capable of communicating with a video card, a sound card, a memory card, and a USB device or communicating with other electronic devices.

The processor 3100 may execute particular calculations or tasks. In example embodiments, the processor 3100 may include a microprocessor or a central processing unit (CPU). The processor 3100 may communicate with the memory device 3200, the storage device 3300 and the input/output device 3400 through an address bus, a control bus, and a data bus. In example embodiments, the processor 3100 can be connected to an expansion bus such as a PCI (Peripheral Component Interconnect) bus.

The memory device 3200 may store data that is used for operations of the computing system 3000. For example, the memory device 3200 may include a DRAM, a mobile DRAM, an SRAM, a PRAM, an FRAM, an RRAM, and/or an MRAM.

The storage device 3300 may include SSD (Solid State Drive), HDD (Hard Disk Drive) or CD-ROM.

The input/output device 3400 may include input devices (e.g., a keyboard, a keypad, a mouse, etc.) and output devices (e.g., a printer, a display, etc.).

The power supply 3500 may supply an operating voltage needed for operations of the computing system 3000.

The image sensor 3600 may include a pixel array formed of unit pixels described with reference to FIGS. 1 to 7. The image sensor 3600 may also include a pixel array formed of unit pixels described with reference to FIG. 9. The image sensor 3600 may be connected with the processor 3100 for communications through the buses or another communication link. The image sensor 3600 and the processor 3100 may be integrated in a chip or in separate chips. The computing system 3000 may be interpreted as any computing system using the image sensor 3600. For example, the computing system 3000 may include a digital camera, a mobile phone, a PDA (Personal Digital Assistants), a PMP (Portable Multimedia Player), a smart phone, and so on.

Figure 14:
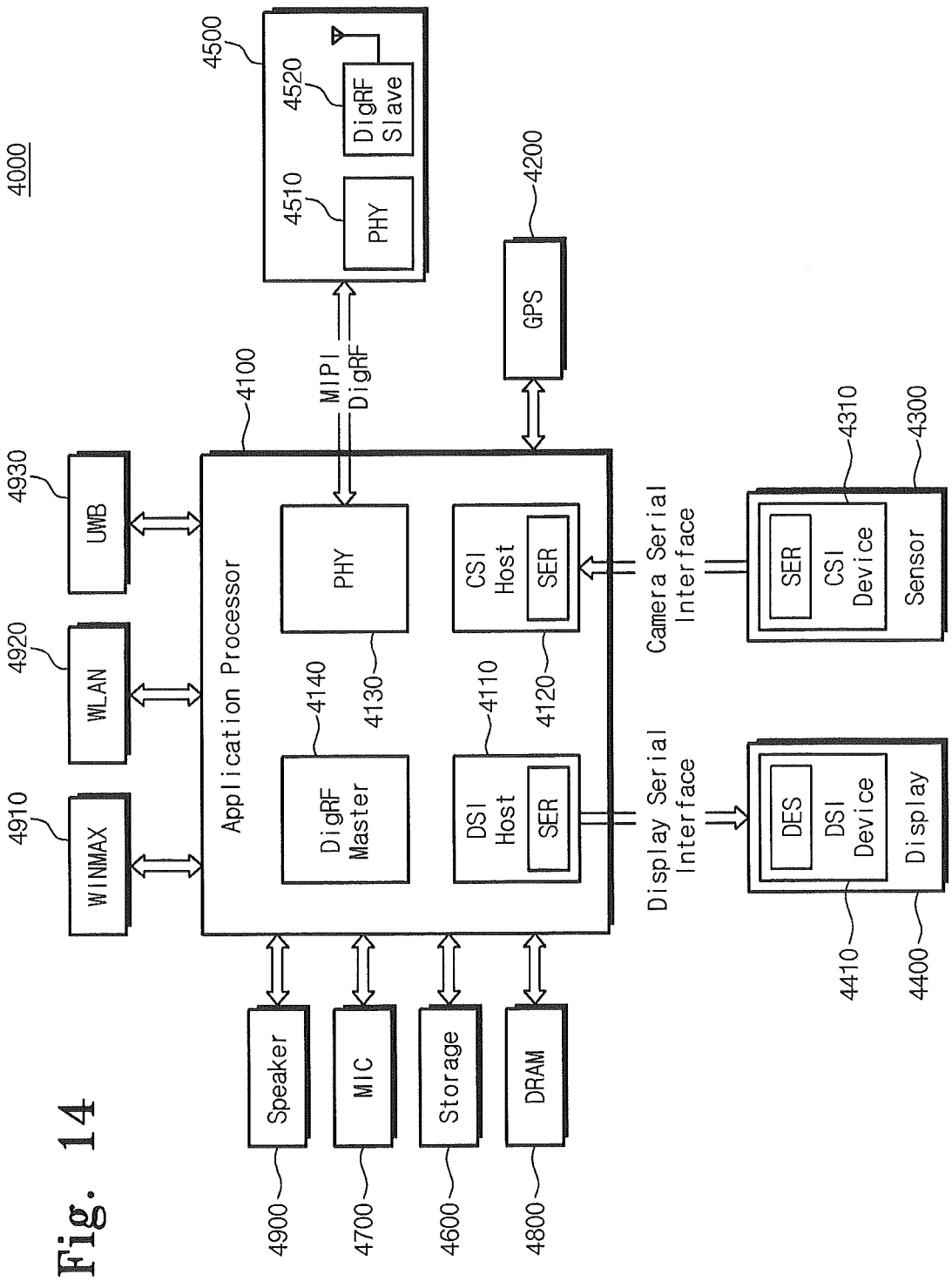
FIG. 14 is a block diagram schematically illustrating an interface used at a computing system of FIG. 13.

FIG. 14 is a block diagram schematically illustrating an interface used at a computing system of FIG. 13. Referring to FIG. 14, a computing system 4000 may be implemented by a data processing device capable of using or supporting an MIPI interface, and may include an application processor (AP) 4100, an image sensor 4300, a display 4400, and so on. A CSI (Camera Serial Interface) host 4120 of the AP 4100 may perform serial communications with a CSI device 4310 in the image sensor 4300.

In example embodiments, the CSI host 4120 may include a de-deserializer (DES), and the CSI device 4310 may include a serializer (SER). The image sensor 4300 may include a pixel array formed of unit pixels described with reference to FIGS. 1 to 7. The image sensor 4300 may also include a pixel array formed of unit pixels described with reference to FIG. 9.

A DSI (Display Serial Interface) host 4110 of the AP 4100 may perform serial communications with a DSI device 4410 of the display 4400 through a DSI. For example, the DSI host 4110 may include a serializer (SER), and the DSI device 4410 may include a deserializer DES.

The computing system 4000 may further include an RF (Radio Frequency) chip 4500 which communicates with the AP 4100. A PHY (Physical layer) 4130 of the AP 4100 and a PHY 4510 of the RF chip 4500 may perform data exchange according to an MIPI (Mobile Industry Processor Interface) DigRF. Also, the PHY 4130 of the AP 4100 may further comprise a DigRF MASTER 4140 to control data exchange according to the MIPI DigRF.

The computing system 4000 may include a GPS (Global Positioning System) 4200, storage 4600, a microphone 4700, a DRAM 4800, and a speaker 4900.

Also, the computing system 4000 may communicate using WIMAX (Worldwide Interoperability for Microwave Access) 4910, WLAN (Wireless Local Area Network) 4920, and UWB (Ultra WideBand) 4930. However, embodiments of the inventive concepts are not limited thereto.

While the inventive concept has been described with reference to exemplary embodiments, it will be apparent to those skilled in the art that various changes and modifications may be made without departing from the spirit and scope of the present inventive concepts. Therefore, it should be understood that the above embodiments are not limiting, but illustrative.

What is claimed is:

1. A unit pixel of a binary image sensor, comprising:
   a substrate having a surface on which light is incident;
   at least one quantum dot on the surface of the substrate;
   source and drain areas in the substrate;
   a channel area between the source and drain areas;
   a gate electrode on the channel area; and
   a charge storage area between the channel area and the at least one quantum dot and configured to store carriers transferred from the at least one quantum dot,
   wherein the at least one quantum dot and the gate electrode are on opposite sides of the channel area, wherein a conductivity type of the charge storage area is different from a conductivity type of the source and drain areas, wherein the substrate comprises a first area having a different conductivity type than the conductivity type of the source and drain areas, and wherein the charge storage area comprises an implanted region in the first area.

2. The unit pixel of claim 1, wherein when a gate voltage is applied to the gate electrode, carriers stored at the charge storage area lower an electrostatic potential of the channel area.

3. The unit pixel of claim 1, wherein the at least one quantum dot and the charge storage area are directly adjacent each other, wherein the unit pixel is configured to operate responsive to a different wavelength of visible light than an adjacent unit pixel of the binary image sensor based on absorption by the at least one quantum dot of the unit pixel.

4. The unit pixel of claim 3, wherein the at least one quantum dot comprises a metallic compound and/or a silicon compound.

5. The unit pixel of claim 4, wherein the metallic compound comprises copper, tungsten, and/or aluminum.

6. A binary image sensor comprising:
a plurality of unit pixels on a substrate having a surface that is configured to receive incident light, the unit pixels respectively comprising:
source and drain regions in the substrate and a channel region therebetween;
a gate electrode on the channel region;
at least one quantum dot on the surface of the substrate; and
a charge storage region between the gate electrode and the at least one quantum dot,
wherein the at least one quantum dot and the gate electrode are on opposite sides of the channel region, wherein a conductivity type of the charge storage region is different from a conductivity type of the source and drain regions, wherein the substrate comprises a first area having a different conductivity type than the conductivity type of the source and drain regions, and wherein the charge storage region comprises an implanted region in the first area.

7. The image sensor of claim 6, wherein the charge storage region is configured to store carriers therein that are generated by the quantum dot responsive to the incident light.

8. The image sensor of claim 7, wherein the channel region is configured such that an electrostatic potential thereof differs responsive to a quantity and/or type of the carriers stored in the charge storage region.

9. The image sensor of claim 8, wherein respective unit pixels of the unit pixels are configured to operate responsive to different respective wavelengths of visible light based on absorption thereof by the at least one quantum dot of the respective unit pixels, wherein the different wavelengths of visible light comprise respective wavelength ranges corresponding to respective colors of a visible spectrum, and wherein the respective unit pixels define a pixel of a pixel array.

10. The image sensor of claim 9, wherein, based on respective different materials of the at least one quantum dot thereof, the respective unit pixels are configured to indicate respective binary information corresponding to the respective colors, wherein the respective unit pixels are separated by an isolation layer therebetween, and wherein the image sensor is free of color filters.

* * * * *